United States Patent [19]

Rosenthal et al.

[11] 4,103,183

[45] Jul. 25, 1978

[54] QUASI-STATIC INVERTER CIRCUIT

[75] Inventors: Bruce David Rosenthal, Highland Park; Andrew Gordon Francis Dingwall, Somerville, both of N.J.

[73] Assignee: RCA Corporation, New York, N.Y.

[21] Appl. No.: 732,785

[22] Filed: Oct. 15, 1976

Related U.S. Application Data

[62] Division of Ser. No. 578,913, May 19, 1975, Pat. No. 4,000,412.

[30] Foreign Application Priority Data

Jun. 5, 1974 [GB] United Kingdom ............... 24898/74

[51] Int. Cl.² ...................... H03K 19/40; H03K 19/08
[52] U.S. Cl. ..................................... 307/214; 307/205
[58] Field of Search ............ 307/220 C, 221 C, 222 C, 307/223 C, 224 C, 225 C, 205, 214, 208, 262

[56] References Cited

U.S. PATENT DOCUMENTS

| | | | |
|---|---|---|---|
| 3,683,202 | 8/1972 | Schmidt, Jr. ........................ | 307/205 |
| 3,737,673 | 6/1973 | Suzuki ........................ | 307/221 C X |
| 3,989,955 | 11/1976 | Suzuki ................... | 307/205 |

Primary Examiner—Larry N. Anagnos
Attorney, Agent, or Firm—H. Christoffersen; Henry I. Schanzer

[57] ABSTRACT

A circuit, whose operating potential includes complementary pulsating signals, functions to produce quasi-static output signals which are virtually independent of the pulsations. An inverter circuit includes a first transistor connected between a first, fixed, operating voltage level and an output terminal and second and third transistors whose conduction paths are connected between the output terminal and, respectively, first and second sources of complementary pulsating signals whose voltages vary, in amplitude, between the first level and a second level. The same input signal is applied to the control electrodes of the second and third transistors whereby one of them always can, when turned on, clamp the output terminal to the second voltage level. The first transistor, when turned on, clamps the output to the first voltage level.

2 Claims, 4 Drawing Figures

QUASI-STATIC INVERTER CIRCUIT

This is a division, of application Ser. No. 578,913, filed 5/19/75, now U.S. Pat. No. 4,000,412.

BACKGROUND OF THE INVENTION

This invention relates to voltage multiplying circuits and to circuits operated by the multiplied voltages.

In many applications, the available power supply potential is too low to operate some circuits or other utilization equipment. Accordingly, there is a need for voltage multiplying circuits for producing voltages of greater magnitude than those available from the main power supply.

BRIEF SUMMARY OF THE INVENTION

Circuits embodying the invention include a first terminal to which is applied a first voltage, and second and third terminals to which are applied complementary pulsating signals which vary in amplitude between the first voltage and a second voltage. The conduction path of a first transistor is connected between the first terminal and an output terminal, and the conduction paths of second and third transistors are connected between the output terminal and the second and third terminals, respectively. The same input signal is applied to the control electrodes of the second and third transistors whereby, when a turn-on signal is present, one of them clamps the output terminal to the second voltage.

BRIEF DESCRIPTION OF THE DRAWINGS

In the accompanying drawings like reference characters denote like components

DETAILED DESCRIPTION OF THE INVENTION

Figure 1:
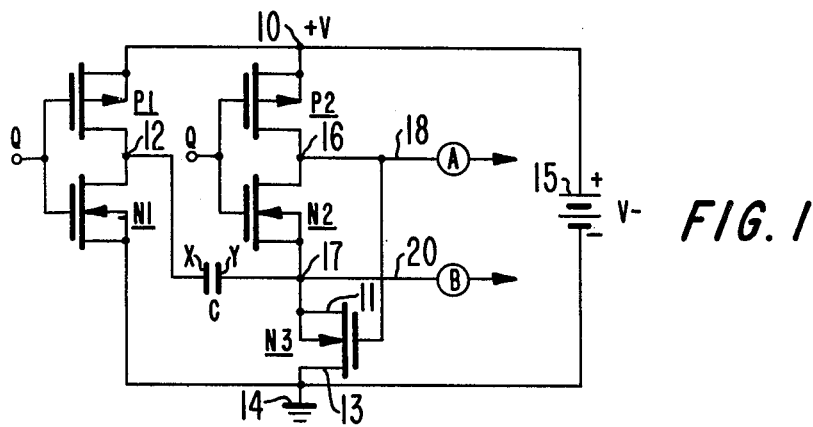
FIG. 1 is a schematic diagram of a voltage multiplying circuit embodying the invention.

The transistors used to illustrate the invention are insulated-gate field-effect transistors (IGFETs) of the enhancement type formed in bulk silicon. But, bipolar transistors, depletion type transistors, or transistors formed on an insulator substrate could be used instead. The transistors of P-conductivity type are formed in an N-substrate. They are identified by the letter P and a reference numeral, and are shown in the drawings either with an arrow on their substrate connection pointing away from the body of the transistor, or an arrow on their source electrode pointing towards the body of the transistor. The transistors of N conductivity are formed in P-wells diffused in the N-substrate. They are identified by the letter N and a reference numeral, and are shown in the drawings either with an arrow on their substrate connection pointing towards the body of the transistor, or an arrow on their source pointing away from the transistor. In general, the substrate of a P-conductivity type transistor should be connected to the most positive potential applied to the source or drain of the transistor and the substrate of an N-conductivity type transistor should be connected to the most negative potential applied to the source or drain of the transistor.

Transistor characteristics are well known and need not be described in detail. But, for a clearer understanding of the description to follow, the following definitions and characteristics pertinent to the invention are set forth:

1. The IGFETs used have a first electrode and a second electrode which define the ends of a conduction path and a control electrode (gate) whose applied potential determines the conductivity of the conduction path. The first and second electrodes of an IGFET are referred to as the source and drain electrodes. For a P-type IGFET the source electrode is defined as that electrode of the first and second electrodes having the highest potential applied thereto. For an N-type IGFET, the source electrode is defined as that electrode of the first and second electrodes having the lowest potential applied thereto.

2. For conduction to occur, the applied gate-to-source potential ($V_{GS}$) must be in a direction to forward bias the gate with respect to the source and must be greater in magnitude than a given value which is defined as the threshold voltage ($V_T$) of the transistor.

3. IGFETs used are bidirectional in the sense that when an enabling signal is applied to the control electrode, current can flow in either direction in the conduction path defined by the first and second electrodes.

4. An IGFET may be made to conduct unidirectionally by connecting its gate to its drain. The IGFET then conducts like a diode, passing current for one polarity of gate-to-source potential and blocking current for the opposite polarity of potential. But the minimum source-to-drain voltage of an IGFET connected as a diode is equal to the $V_T$ of the transistor. This is also true of an IGFET when normally operated as a source-follower. In contrast, when operated in the common source mode, the IGFET has a relatively low "on" impedance between its source and drain. Current flow through the IGFET produces a voltage drop between the source and drain. But, for negligible drain-to-source current there is substantially no voltage drop and hence no offset between the drain and source.

The circuit of FIG. 1 includes a complementary inverter comprised of transistors P1 and N1. Transistor P1 is connected at its source and substrate to terminal 10 and at its drain to terminal 12. Transistor N1 is connected at its drain to terminal 12 and at its source and substrate to terminal 14. Transistor P2 is connected at its source and substrate to terminal 10 and at its drain to terminal 16 at which is produced an output signal identified as "A." Transistor N2 is connected at its drain to terminal 16 and at its source and substrate to terminal 17 at which is produced an output signal identified as "B." Conductors 18 and 20 are connected to terminals 16 and 17, respectively. Electrodes 11 and 13 define the ends of the conduction path of transistor N3. Electrode 11 and the substrate of transistor N3 are connected to terminal 17, electrode 13 is connected to terminal 14 and the gate of transistor N3 is connected to terminal 16.

A capacitor C is connected between terminals 12 and 17. The value of the capacitor is dependent on the amount of charge it is necessary to apply to utilization circuits (not shown) connected to terminals 16 and 17 by means of conductors 18 and 20, respectively. The capacitor may be an integrated, on chip, component or a discrete, off chip, component. In the discussion to follow, the terminal, side, or plate of capacitor C connected to terminal 12 will be referred to as plate X or "X" and the terminal side, or plate connected to terminal 17 will be referred to as plate Y or "Y."

Figure 2:
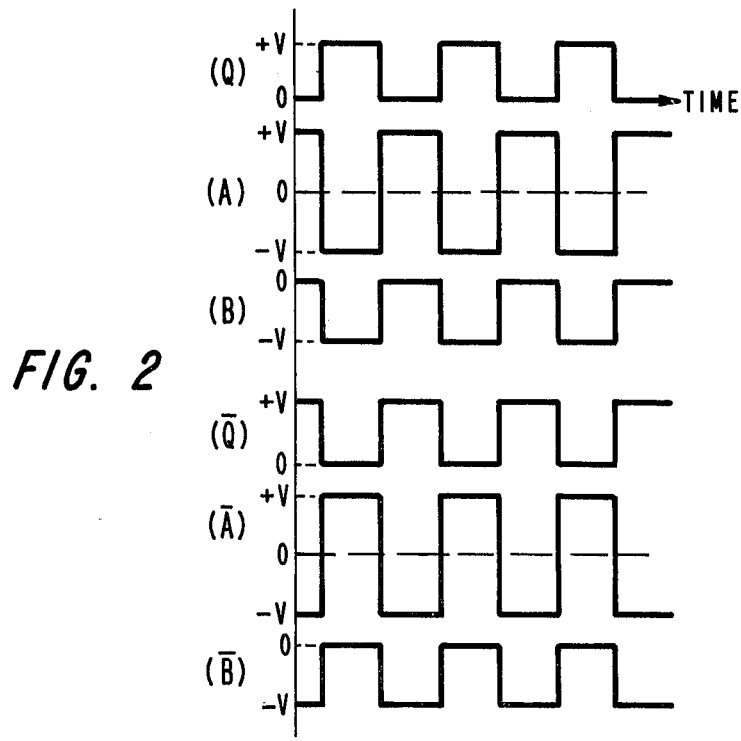
FIG. 2 is a diagram of waveforms at various inputs and outputs of the circuits of FIGS. 1 and 4.

A power supply 15 having a magnitude of V volts is connected at its positive terminal (+V volts) to terminal 10 and at its negative terminal (ground) to ground terminal 14. For the circuit to function, V volts must exceed the threshold voltages of the transistors used in the circuit. An input signal, Q, is applied to the gate electrodes of transistors P1, N1, P2 and N2. The signal Q, as shown in FIG. 2, varies in value between +V volts and ground, and may be a repetitive clock signal or an aperiodic pulse or pulse train.

In the operation of the circuit of FIG. 1 when the signal Q goes low (to ground) transistors N1 and N2 are turned off and transistors P1 and P2 are turned on. When transistor P1 is turned on, the potential at terminal 12 and plate X of capacitor C charges up to +V volts through the low on impedance of transistor P1. When transistor P2 is turned on, +V volts is applied to terminal 16 and to the gate of transistor N3. Transistor N3 is fully on and conducts conventional current from terminal 17 to terminal 14 with electrode 11 functioning as the drain and electrode 13 functioning as the source. Thus, transistor N3 clamps terminal 17 and plate Y of capacitor C to ground. Capacitor C charges to the full V volts through transistor P1 and N3, with plate X at +V volts. Transistors P1 and N3 are operated in the common source mode. In this mode of operation the transistors behave like extremely low impedance switches with no threshold voltage offsets. If, for example, transistors P1 and N3 are turned on for a period of time T greater than three time constants ($\tau$), where $\tau$ is equal to the product of C and the sum of the "on" impedances of transistors P1 and N3, then capacitor C is charged to at least 96% of V volts. By selecting the period T to be greater than $5\tau$ it may be assumed that C is charged to the full value of the power supply potential.

When the signal Q goes high (to +V volts), transistors P1 and P2 are turned off and transistors N1 and N2 are turned on. The turn off of transistor P2 removes the turn on potential to the gate of transistor N3. The turn off of transistors P1 and N3 isolates plates X and Y of C from power supply terminals 10 and 14, respectively. When transistor N1 turns on, plate X of capacitor C which was charged to +V volts is clamped and discharged to ground through the low impedance conduction path of transistor N1. This is equivalent to applying a negative voltage step of V volts amplitude to plate X. Since the potential across a capacitor cannot change instantaneously, the potential at Y of capacitor C goes negative by V volts. The potential at Y and terminal 17, which was initially at 0 volts, goes from 0 volts to −V volts as shown in waveform B of FIG. 2.

Transistor N2 with +V volts applied to its gate and −V volts applied to its source electrode, is turned on hard and conducts in the common source mode, clamping terminal 16 to terminal 17 and causing the potential at terminal 16 to go from +V volts to −V volts. This −V volts signal coupled to terminal 16 is applied to the gate of transistor N3 keeping if off or, if on, turning it off.

When Q goes high, electrode 11 of transistor N3 goes to −V volts while electrode 13 is at ground potential. Electrode 11 now functions as the source and electrode 13 as the drain of transistor N3. If the potential at the gate of transistor 13 were positive with respect to −V volts, it would conduct conventional current from terminal 14 to terminal 17 preventing the potential at terminal 17 from going to −V volts. Transistor N2, when on, functions as a low impedance connection between the gate and source 11 of transistor N3 and keeps it turned off. Also, transistor N2 couples the −V volts generated at terminal 17 to terminal 16, causing the potential at the latter and at the gate of transistor N3 to go to −V volts.

The turn on and turn off of transistor N3 by means of transistors P2 and N2 is of great importance. Transistor P2, when on, provides a turn on signal for N3 and also establishes a +V volt level on conductor 18. Transistor N3, when turned N2. on, conducts in the common source mode and provides an excellent clamp between ground and plate Y. The ability to establish ground potential at plate Y, during the charging period, enables the negative potential subsequently produced at Y to be substantially equal to −V volts when terminal X is switched from +V volts to ground. That is, there is no positive voltage residual at Y to substract from the −V volts step coupled through the capacitor. The problem of turning off the inherently bilateral switch N3 when the potential at its electrode 11 goes negative is solved by use of transistor n2. With transistor N3 turned off, the potential at Y may go to −V volts and the potential between terminals 10 and 17 is 2V volts which is twice the amplitude of power supply 15. Thus, when P1 and P2 turn off and N1 and N2 turn on, the potential (B) at terminal 17 goes from zero volts to −V volts and the potential at terminal 16 goes from +V volts to −V volts. The amplitude of the signal A is, therefore, approximately 2V volts as shown in FIG. 2.

The transistors of the circuit, when conducting, conduct in the common source mode and thus function, as nearly as possible, as ideal switches.

Connecting the substrate of transistor N3 to terminal 17 ensures proper operation of the circuit. When transistor N3 is conducting the potential at terminal 17 never is less positive than that at terminal 14. The P-substrate and the region corresponding to electrode 13 form a forward biased parasitic diode. But, since this diode is in parallel with the conduction path of transistor N3 it aids in conducting the charging current of capacitor C. When transistor N3 is turned off and the potential at 17 goes negative it is important that the substrate of N3 be connected to electrode 11, now functioning as the source, to ensure that there are no conduction or leakage paths between terminals 14 and 17. If the substrate of N3 were connected to ground, the P-substrate-to-region 11 would form a parasitic diode conducting in the forward direction from terminal 14 to terminal 17 preventing the development of the full negative potential.

When Q goes "low" again, A goes to +V volts and turns on transistor N3, transistors P1 and P2 are turned on, transistors N1 and N2 are turned off, and capacitor C charges, as described above, to restore any charge that may have leaked off.

It has thus been shown that a pulsating signal B is generated having the same amplitude as the power supply, but having a voltage range which lies outside the range of the power supply. In effect, the charging signal (+V volts) present at X when discharged to ground results in a negative step (−V volts) which is coupled through the capacitor C and which is level shifted with respect to the direct current (d.c.) level (ground) at Y to produce a potential level (−V volts) which exceeds the range of the power supply. It has also been shown that a pulsating signal A is generated which has twice the amplitude of the power supply voltage.

Figure 3:
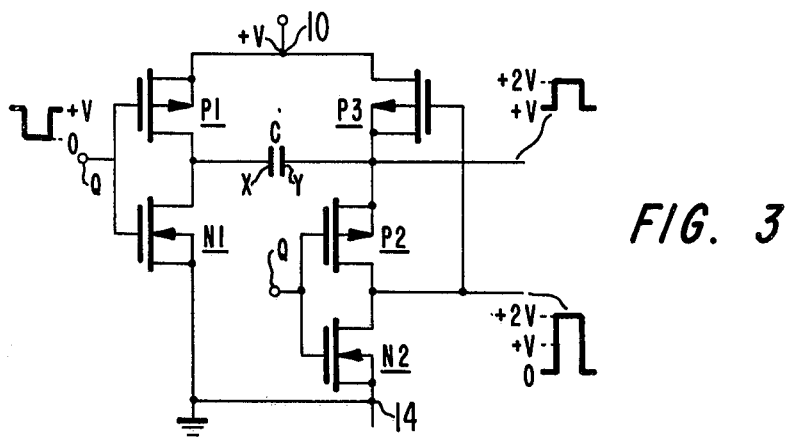
FIG. 3 is another schematic diagram of a circuit embodying the invention.

The circuit of FIG. 3 is the complement of the circuit of FIG. 1. In it, the P transistors of FIG. 1 have been replaced by N transistors, the N transistors by P transistors and the whole transistor arrangement being then inverted between terminals 10 and 14. In the circuit of FIG. 3, voltages more positive than the most positive power supply potential (+V) are produced. In contrast, thereto, in FIG. 1 voltages more negative than the most negative power supply potential (ground) were produced. In the circuit of FIG. 3, when Q goes high (+V) transistors N1 and N2 are turned on and when transistor N2 conducts, it turns on transistor P3. This causes plate X to be at ground, plate Y to be at +V volts and capacitor C to be charged to +V volts. When Q goes low, N1 and N2 turn off and P1 and P2 turn on. A positive voltage step of +V volts is applied to plate X. Since the potential across C cannot change instantaneously, the potential at Y goes from +V volts to +2V volts. Transistor P2 couples the 2V volts at plate Y to the gate of transistor P3 turning it off or keeping it turned off, and preventing the capacitor C from discharging into terminal 10. Thus, the potential at Y swings from V volts to 2V volts and the potential at the drains of P2 and N2 swings between 0 volts and +2V volts.

Figure 4:
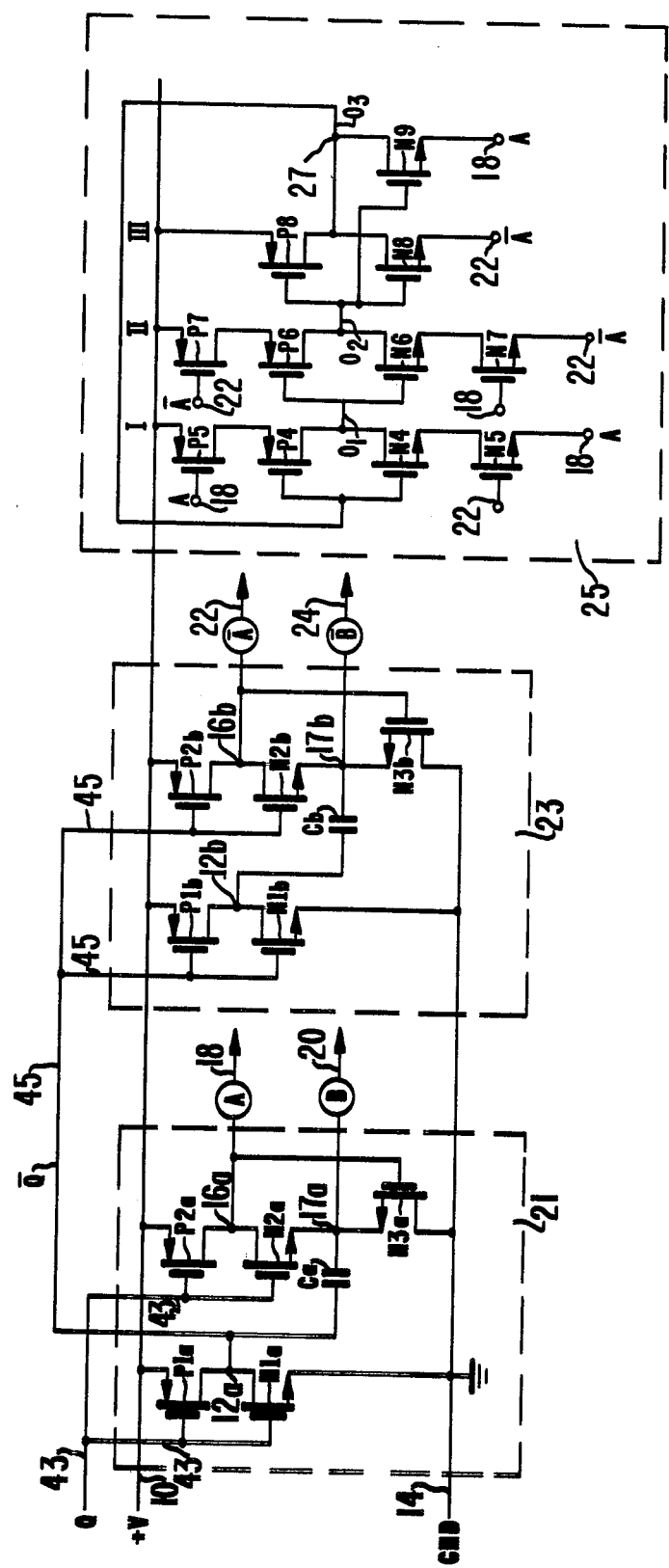
FIG. 4 is a schematic diagram of a circuit embodying the invention in which pulsating signals are produced and applied to a counter circuit.

The circuit of FIG. 4 includes two voltage multiplying sections 21 and 23 and a dynamic binary counter stage 25 which is operated by means of pulsating signals produced by sections 21 and 23. The structure of each one of sections 21 and 23 corresponds to the structure of FIG. 1. The elements and nodes of sections 21 and 23 corresponding to the elements and nodes of the circuit of FIG. 1 bear like reference numerals with the addition of the characters *a* and *b* respectively, to their reference numerals. Output terminals 16*a* and 17*a* at which are produced outputs A and B, respectively, are connected to conductors 18 and 20. Outputs 16*b* and 17*b* at which are produced outputs $\overline{A}$ and $\overline{B}$, respectively, are connected to conductors 22 and 24.

The operation of the circuits in each one of section 21 and 23 is similar to the circuit shown in FIG. 1, described above, and need not be repeated in detail.

Clocking pulses Q are applied via conductor 43 to the gates of transistors P1*a*, N1*a*, P2*a*, and N2*a*. Clock pulses $\overline{Q}$, the complement of Q, are produced at the drains of transistors P1a and N1a. They are applied via conductor 45, connected to terminal 12*a*, to the gates of transistors P1*b*, N1*b*, P2*b* and N2*b*. However, it should be appreciated that Q and $\overline{Q}$ could be produced by independent means. In response to the variation in the clock pulse Q there is produced at output connections 18 and 20 signals A and B respectively. In response to the clock pulse $\overline{Q}$, there is produced at output connections 22 and 24 signals $\overline{A}$ and $\overline{B}$, respectively, which are the complements of signals A and B. The waveforms of these signals are illustrated in FIG. 2.

The binary counter section 25 includes 3 groups or strings of transistors denoted by roman numerals I, II and III.

In the first string (I), the conduction paths of transistors P5, P4, N4 and N5 are connected in series and in the second string (II), the conduction paths of transistors P7, P6, N6 and N7 are connected in series. Transistors P5 and P7 are connected at their source electrodes to conductor 10. The drains of transistors P4 and N4, which define the output $0_1$ of string I, are connected to the gates of transistors P6 and N6. The gates of transistors P5 and N7 and the source of transistor N5 are connected to conductor 18 to which is applied the signal A. The gates of transistors P7 and N5 and the source of transistor N7 are connected to conductor 22 to which is applied the signal $\overline{A}$.

In the third string (III), transistor P8 has its conduction path connected between terminals 10 and 27. Transistor N8 has its conduction path connected between terminal 27 and conductor 22 and transistor N9 has its conduction path connected between terminal 27 and conductor 18. The drains of transistors P6 and N6, which define the output ($O_2$) of the second string, are connected to the gates of transistors P8, N8 and N9. Terminal 27 at which is produced the output ($O_3$) of the third group of transistors is connected to the gates of transistors P4 and N4. Transistors P8, N8, and N9 form a quasi static complementary inverter, as described below.

The operation of the circuit of FIG. 4 as a binary counter is as follows:

When A = +V and $\overline{A}$ = −V: (*a*) the string I of transistors is non-conductive (transistors P5 and N5 are cut off and output $O_1$ retains its former value regardless of the value of its input ($O_3$); (*b*) the string II of transistors is conductive and produces at its output ($O_2$) the inverse of the signal ($O_1$) present at its input; (*c*) the group III of transistors always functions as a complementary inverter. Either $\overline{A}$ is low in which case transistors P8 and N8 form a complementary inverter (transistor N9 is reverse biased since A is high) or A is low in which case transistors P8 and N9 form a complementary inverter (transistor N8 is reverse biased since $\overline{A}$ is high).

When A = −V and $\overline{A}$ = +V: (*a*) the string I of transistors is conductive. Transistors P5 and N5 are switched on and transistors P4 and N4 produce at their drains an output signal $O_1$ which is the inverse of the signal $O_3$ applied to their gates; (*b*) the string II of transistors is non-conductive since transistors P7 and N7 are switched off. The output signal $O_2$ remains set at its previous level; (*c*) the group III of transistors P8 and N9 functions as an inverter. Transistor N8 with $\overline{A}$ = +V volts applied to its source remains cut off regardless of the signal (−V or +V) applied to its gate.

1. Assume now that $O_1$ is initially at +V volts and that A = +V (high) and $\overline{A}$ = −V (low). In string I, transistors P5 and N5 are cut off and $O_1$ remains high regardless of the value of $O_3$. In string II, transistors P7 and N7 are switched on. $O_1$ high causes transistor P6 to be cut off and transistor N6 to be turned on. This causes $O_2$ to go to −V volts by conduction through transistors N6 and N7. With $O_2$ at −V volts, transistor P8 is turned on and transistor N8 is turned off. As mentioned above, transistor N9 with +V volts applied to its source is turned off regardless of the signal at $O_2$. With transistor P8 turned on, +V volts is supplied to terminal 27 and the signal $O_3$ goes high.

2. Assume now that A goes to −V volts (low) and that $\overline{A}$ goes to +V volts (high).

In string I, transistors P5 and N5 are turned on. With $O_3$ high applied to the gates of transistors P4 and N4, transistor P4 is cut off and transistor N4 is turned on. This causes the signal $O_1$ to go to −V volts by means of conduction through transistors N4 and N5 to conductor 18. The change of the signal $O_1$ from high to low does not alter the signal $O_2$ since in string II transistors P7 and N7 are cut off and the transistors of string II are nonconductive. With $O_2$ remaining at its previous level, the signal $O_3$ remains high.

3. Assume now that A returns to $+V$ volts (high) and that $\overline{A}$ goes to $-V$ volts (low).

The transistors P5 and N5 in string I remain cut off and the signal $O_1$ remains low. Transistors P7 and N7 in string II are switched on. With $O_1$ low applied to the gates of transistors P6 and N6, transistor N6 is cut off and transistor P6 is turned on. This causes the signal $O_2$ to rise up to $+V$ volts. The $+V$ volts applied to the gates of transistors P8 and N8 turn on the latter and cut off the former. As a result, the potential at terminal 27 goes to $-V$ volts by means of the conduction path of transistor N8 to conductor 22. Thus, the signal $O_3$ goes low.

4. Assume now that A makes a transition to $-V$ volts (low) and that $\overline{A}$ makes a transition to $+V$ volts (high). With $O_3$ low, the signal $O_1$ goes high while the signal $O_2$ remains at the level to which it was set prior to the transition of A from low to high and the signal $O_3$ remains low. The signal levels present at terminals $O_1$, $O_2$ and $O_3$ now correspond to the signal levels in the circuit in paragraph number one above. Therefore, the original conditions discussed above have been restored to the circuit.

It should be evident from the discussion above that the signal $O_1$, $O_2$ and $O_3$ change state once for every two transitions of the signals A and $\overline{A}$. Therefore, the circuit effectively functions to divide the clock frequency (A and $\overline{A}$) by a factor of 2. Any one of the signal levels $O_1$, $O_2$ and $O_3$, but preferably $O_3$, can then be connected to a subsequent stage identical in structure to the circuit shown in section 25 or in the alternative to a different circuit which can further count down the clock frequency.

It is important to note that the pulse voltage signals A and its inverse $\overline{A}$ may be used to simulate a continuous supply. For example, in the third string of the counter stage a quasi static inverter is formed by connecting two N channel transistors N8, N9 to the pulsating supplies. The two transistors having their gates connected in common to a single point are equivalent functionally to a single transistor connected to a direct current (d.c.) power supply. The counter stage 25 does not require a continuous negative power supply. However, a continuous negative power supply could have been supplied by connecting a transistor (not shown) between the drain of transistor N5 and conductor 22 and between the drain of transistor N7 and conductor 18 and by applying to the gates of these transistors the complement of the signal applied to their sources.

It should be appreciated that the counter stage shows that certain circuits may be produced which may be operated from pulsating supplies. It should also be appreciated that circuits may be operated from a pulsating power supply and by means of additional transistors may function as if they were operated from a steady d.c. power supply.

It should also be appreciated that in the circuit of FIG. 4 the power supply potential $+V$ has been used to produce complementary pulsating potentials whose amplitude exceeds that of the power supply voltage. The complementary potentials have sufficient amplitude to operate counting circuits which might not be operable at the lower power supply potential. Furthermore, it is the frequency of the complementary potentials which is divided down by the counting circuits.

What is claimed is:

1. The combination comprising,
a first conductor adapted to receive a first potential;
second and third conductors adapted to receive complementary pulsating potentials;
first, second and third transistors, each transistor having first and second electrodes defining the ends of a conduction path and a control electrode; said first transistor being of one conductivity type and said second and third transistors being of opposite conductivity type;
an output terminal;
means connecting the conduction path of said first transistor between said first conductor and said output terminal;
means connecting the conduction paths of said second and third transistors between said output terminal and said second and third conductors, respectively;
an input terminal for the application thereto of a signal to be inverted; and
means for connecting the control electrodes of said first, second and third transistors to said input terminal.

2. The combination as claimed in claim 1 wherein said transistors are insulated-gate field-effect transistors.

* * * * *